(12) United States Patent
Pierenkemper

(10) Patent No.: US 6,687,033 B2
(45) Date of Patent: Feb. 3, 2004

(54) OPTICAL SCANNING DEVICE

(75) Inventor: Hans-Werner Pierenkemper, Emmendingen (DE)

(73) Assignee: Sick AG, Waldkirch (DE)

(*) Notice: Subject to any disclaimer, the term of this patent is extended or adjusted under 35 U.S.C. 154(b) by 0 days.

(21) Appl. No.: 09/766,561

(22) Filed: Jan. 18, 2001

(65) Prior Publication Data
US 2001/0012145 A1 Aug. 9, 2001

(30) Foreign Application Priority Data
Jan. 19, 2000 (DE) .......................... 100 02 090

(51) Int. Cl.$^7$ .............................. G02B 26/08
(52) U.S. Cl. ............... 359/196; 359/201; 359/203; 359/212; 359/216; 235/462.39
(58) Field of Search ............... 359/201–203, 359/216–219, 208; 235/462.36–462.4

(56) References Cited

U.S. PATENT DOCUMENTS 4,753,498 A * 6/1988 Saitoh et al. ............... 359/203

FOREIGN PATENT DOCUMENTS

| DE | 22 48 768 | 10/1976 |
| DE | 9421457 U1 | 2/1996 |
| DE | 29620422 U1 | 3/1997 |
| DE | 19709906 A1 | 9/1998 |

* cited by examiner

Primary Examiner—James Phan
(74) Attorney, Agent, or Firm—Townsend and Townsend and Crew LLP

(57) ABSTRACT

An optical scanning device has a light transmitter and a light receiver which are arranged in spatial proximity to one another and which each comprise a deflecting device with which a scanning light beam emitted by a transmitter unit is directable along a transmission path onto an object to be scanned and, after reflection at said object, along a reception path onto a receiving unit, with the transmission path and the reception path being optically separated from one another in the region of the light transmitter and the light receiver.

10 Claims, 1 Drawing Sheet

OPTICAL SCANNING DEVICE

BACKGROUND OF THE INVENTION

The invention relates to an optical scanning device comprising a light transmitter and a light receiver which are arranged in spatial proximity to one another and which each comprise a deflecting device with which a scanning light beam emitted by a transmitter unit is directable along a transmission path onto an object to be scanned and, after reflection at said object, along a reception path onto a receiving unit.

Such scanning devices serve, for example, as range finders which work according to the principle of light transit time and in which the transmitting unit comprises a laser device.

These systems are characterized by high sensitivity of the light receiver which can be in the range of some nW so that a reliable detection of objects with low degrees of reflection is ensured. The transmitting power of the light transmitter is, in contrast, a plurality of orders of magnitude higher and can be, for example, in the range of some mW to some W.

It is a problem with such systems that measures are required, in particular due to the high sensitivity of the light receiver in comparison with the transmitting power, to avoid the system blinding itself, i.e. to prevent light transmitted from the light transmitter which is not reflected from the object to be scanned, but from other objects, from being detected by the receiver unit. Known sources for such interfering scattered light include, for example, the front plates provided for the passage of light, which result in a disadvantageous scattering of the transmitted light, in particular in a dirty state. It is in particular problematic that self-blinding of the system can result in saturation effects of the receiver electronics which make it impossible to measure the light transit time with a high temporal resolution.

SUMMARY OF THE INVENTION

It is an object of the invention to provide an optical scanning device of the kind initially mentioned in which self-blinding is reliably avoided and which, at the same time, has the simplest possible design.

This object is satisfied in accordance with the invention starting from an optical scanning device of the kind initially mentioned by the transmission path and the reception path being optically separated from one another in the region of the light transmitter and the light receiver.

The possibility of scattered light being able to enter the reception path from the transmission path and resulting in the receiving unit being blinded is excluded by the optical separation between the transmission path and the reception path in the region of the light transmitter and the light receiver. Cross-talk between the transmission path and the reception path can thus be completely avoided in accordance with the invention.

In a preferred embodiment of the invention, the light transmitter and the light receiver are arranged in a common housing, with the transmission path and the reception path being optically separated from one another inside the housing. Said separation is preferably effected by the light transmitter and the light receiver each being arranged in a respective chamber of the housing, with the transmitting chamber and the receiving chamber being separated from one another in a light-tight manner by a partition wall.

The optical separation between the transmitting channel and the receiving channel is hereby effected with very simple design means. The scanning device in accordance with the invention can thus be made at a particularly favorable cost.

The transmitting chamber and the receiving chamber can be closed by a light permeable window. The transmitting unit and the receiving unit can thus be protected against external influences, with scattering effects at the light permeable windows being unproblematic due to the light-tight separation between the transmitting chamber and the receiving chamber.

In a preferred practical embodiment of the invention, a deflecting unit in the form of a mirror wheel drivable to execute a rotary movement is associated with both the transmitting unit and the receiving unit. On the transmitter side, it is possible to generate scanning beams executing a periodic scanning movement with such a mirror wheel, also known as a polygon. Interfering scattered light is effectively avoided by the optical separation in accordance with the invention between the transmitting channel and the receiving channel, in particular with such scanner systems where there was a high potential risk of self-blinding up to now.

It is preferred for both mirror wheels to be drivable to execute a joint rotary movement and to have a common drive shaft guided in a light-tight manner through the dividing wall between the transmitting chamber and the receiving chamber.

In this process, the two mirror wheels arranged at the common drive shaft can be considered as a single deflecting unit in the form of a divided mirror wheel for the whole system, with a transmitting section and a receiving section being completely separated from one another in an optical respect by the partition wall in said deflecting unit. The synchronization of the two mirror wheels or the two sections of the common, divided mirror wheel is ensured in this process by the common rotary movement, while the penetration of interfering scattered light into the reception paths is completely excluded.

The invention is described in the following by way of example with reference to the drawing.

DESCRIPTION OF THE PREFERRED EMBODIMENTS

Figure 1:
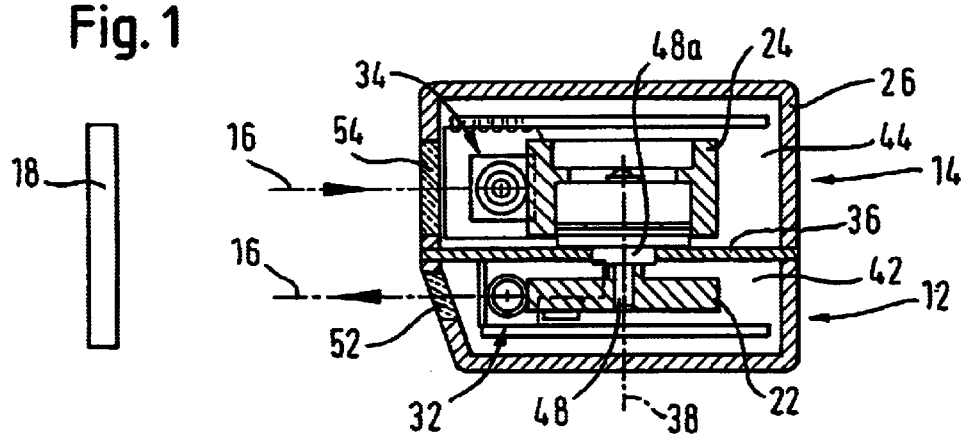
FIG. 1 shows an optical scanning device in accordance with an embodiment of the invention in a sectioned view.

The optical scanning device in accordance with FIG. 1 comprises a light transmitter 12 and a light receiver 14 which are each arranged in close proximity to one another in a respective chamber 42, 44 of a common housing 26. The transmitting chamber 42 and the receiving chamber 44 are separated from one another by a light-tight partition wall 36. A light permeable window 52, 54, made for example of glass, is provided for each of the chambers 42, 44 in the housing wall.

Figure 2A:
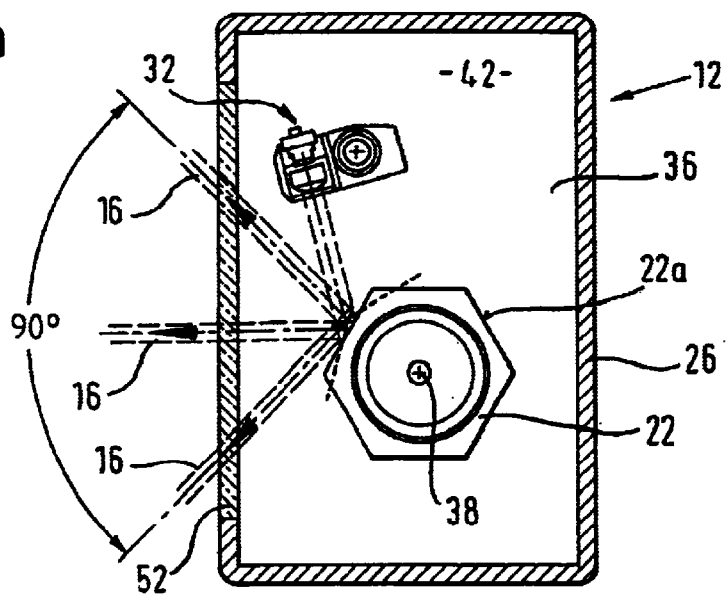
FIG. 2a shows the scanning device of FIG. 1 in a sectioned view, turned 90° with respect to FIG. 1, in the region of a light transmitter.
Figure 2B:
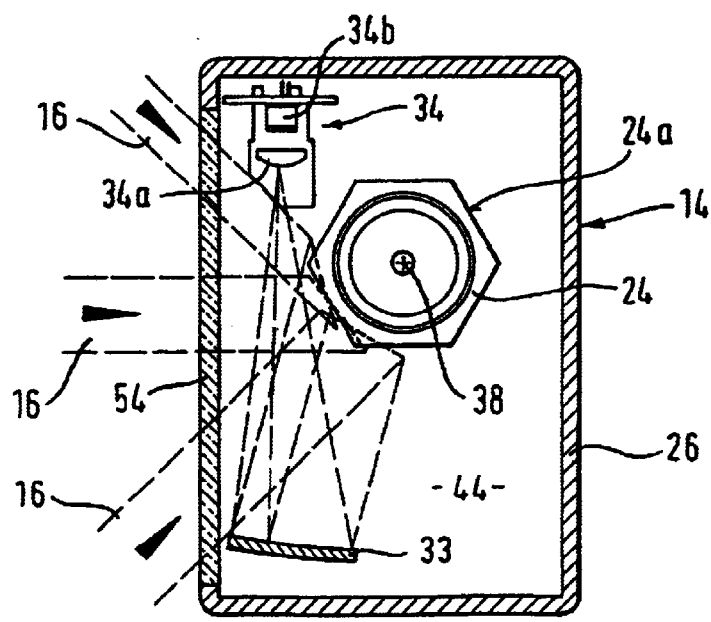
FIG. 2b shows a view corresponding to FIG. 2a in the region of a light receiver.

Reference is also made to the views of FIGS. 2a and 2b, each turned through 90° with respect to FIG. 1, to describe the light transmitter 12 and the light receiver 14.

The light transmitter 12 comprises a transmitting unit 32 with a laser apparatus and a deflecting device 22 in the form of a drivable mirror wheel rotatable around an axis 38. Light emitted from the laser of the transmitting unit 32 is incident to one of the planar mirror surfaces 22a of the mirror wheel 22, which rotates in operation, and is reflected at a certain angle, in this embodiment at an angle in an angular range of approximately 90°, through the window 52 as a scanning light beam 16 in dependence on the instantaneous angular position of said mirror wheel 22. The totality of all light propagation paths for scanning light beams 16 coming from the transmitting unit 32 forms one transmission path up to the reflection at an object 18 (cf. FIG. 1) whose distance is to be measured.

The light receiver 14 comprises a mirror wheel 24, formed in correspondence with the mirror wheel 22 of the light transmitter 12, a focusing device 33 in the form of a concave mirror and a receiving unit 34 with a lens arrangement 34a and a light-sensitive element 34b.

The totality of all light propagation paths for scanning light beams reflected from the object 18 forms one transmission path up to detection at the receiving unit.

The light beams 16 reflected from the object 18 and being propagated along the reception path enter the receiving chamber 44 through the window 54 and are reflected from one of the light-reflecting surfaces 24a of the mirror wheel 24 onto the concave mirror 33 and are focused by this onto the lens arrangement 34a of the receiving unit 34.

The mirror wheels 22, 24 are attached to a common drive shaft 48 and are thus drivable to execute a joint rotary movement, with said mirror wheels 22, 24 being aligned relative to one another such that the mirror surfaces 22a and 24a are not offset against one another, but are each in the same plane.

The two deflecting devices 22, 24 of the light transmitter 12 and the light receiver 14 thus form a single mirror wheel which is split by the partition wall 36. The partition wall 36 extends into the spacing of the split mirror wheel 22, 24 up to the common drive shaft 48, or a cover 48a surrounding the drive shaft 48, such that the drive shaft 48 is guided in a light-tight manner through the partition wall 36. It is thus also ensured that no stray light can enter into the receiving chamber 44 from the transmitting chamber 42 in the region of the passage of the drive shaft 48.

The optical scanning device in accordance with the invention is not a coaxial system; the transmission path and the reception path are rather adjacent to one another and extend approximately parallel to one another between the object 18 and the respective deflecting device 22, 224. The angle between the transmission path and the reception path, which is dependent on the distance between the housing 26 and the object 18 and on the spacing between the light transmitter 12 and the light receiver 14 perpendicular to the direction of the propagation of the light, is taken into consideration in the evaluation of the signals detected by the receiving unit 34. This angle is unproblematic with respect to the energy balance of the system, in particular because said perpendicular spacing between the light transmitter 12 and the light receiver 14 (geometric base) is a plurality of orders of magnitude smaller than the distance between the housing 26 and the object 18 (working or scanning range of the scanner).

The same angular segments are scanned synchronously by the mirror wheels 22, 24 in scanning operation. Nevertheless, an auto-collimating function is still present, whereby external light or background radiation is suppressed.

The transmission path and the reception path are completely separated from one another in an optical respect inside the housing 26 by the partition wall 36 between the transmission path 42 containing the light transmitter 12 and the receiving chamber 42 containing the light receiver 14, so that cross-talk between the transmission path and the reception path is reliably excluded. There is consequently no self-blinding of the system, even if the light permeable windows 52, 54 are dirty.

A substantial advantage of the invention consists of the receiver 14 being in no way influenced by the transmitter 12 and thus being capable of construction completely independent of the transmitter 12, e.g. with the aim of linearizing the receiving amplitude over the distance to the object 18, i.e. over the scanning distance of the scanner. It is therefore possible to concentrate on optimum reception properties in the design of the receiver 14 without having to consider potential interference from the transmitter 12.

Another substantial advantage of the invention is found in the design simplicity of the arrangement and the possibility of using favorably-priced components which, in particular, do not have to have any special optical or electrical shielding. A further advantage comprises the scanning device being capable of realization with a comparatively low construction size.

What is claimed is:

1. An optical scanning device comprising a light transmitter and a light receiver which are arranged in spatial proximity to one another, a housing including a transmitting chamber and a receiving chamber, the chambers being separated from one another in a light-tight manner by a partition wall, the light transmitter and the light receiver being arranged in the transmitting chamber and the receiving chamber, respectively, of the housing, the light transmitter and the light receiver each comprising a deflecting device with which a scanning light beam emitted by a transmitter unit is directable along a transmission path onto an object to be scanned and, after reflection at said object, along a reception path onto a receiving unit, the transmission path and the reception path being optically separated from one another in the region of the light transmitter and the light receiver.

2. An optical scanning device in accordance with claim 1 wherein the transmission path and the reception path are optically separated from one another inside the housing.

3. An optical scanning device in accordance with claim 1 wherein at least one of the transmitting chamber and the receiving chamber is closed by a light permeable window made of glass.

4. An optical scanning device in accordance with claim 1 wherein the transmission path and the reception path extend approximately parallel to one another at least outside a housing.

5. An optical scanning device in accordance with claim 1 wherein at least the deflecting device associated with the transmitting unit has at least one, periodically movable, light-reflecting surface for generating a scanning light beam executing a periodical scanning movement.

6. An optical scanning device in accordance with claim 5 wherein the deflecting device comprises a plurality of light-reflecting surfaces forming at least a part of a polyhedron.

7. An optical scanning device in accordance with claim 6 wherein the light deflecting surfaces are formed as a rotatable mirror wheel.

8. An optical scanning device in accordance with claim 1 wherein the receiving unit comprises a deflecting device having a focusing device including a concave mirror arranged in the reception path between the deflecting device and the receiving unit for concentrating light beams reflected from the deflecting unit to the receiving unit.

9. An optical scanning device in accordance with claim 1 including first and second deflecting devices arranged on a common axis of rotation and drivable to execute a joint rotary movement.

10. An optical scanning device in accordance with claim 9 wherein the deflecting devices include a common drive shaft guided in a light-tight manner through the partition wall between the transmitting chamber and the receiving chamber.

* * * * *